(12) United States Patent
Kuhnmünch et al.

(10) Patent No.: US 11,373,840 B1
(45) Date of Patent: Jun. 28, 2022

(54) TOOL FOR TEM GRID APPLICATIONS

(71) Applicant: Bruker AXS GmbH, Karlsruhe (DE)

(72) Inventors: Norbert Kuhnmünch, Pfinztal (DE);
Nadia Linda Lengweiler,
Grafenhausen (DE)

( * ) Notice: Subject to any disclaimer, the term of this patent is extended or adjusted under 35 U.S.C. 154(b) by 0 days.

(21) Appl. No.: 17/677,117

(22) Filed: Feb. 22, 2022

(30) Foreign Application Priority Data

Feb. 23, 2021 (EP) ..................... 21158699

(51) Int. Cl.
*H01J 37/26* (2006.01)
*H01J 37/20* (2006.01)

(52) U.S. Cl.
CPC .............. *H01J 37/26* (2013.01); *H01J 37/20* (2013.01); *G01N 2223/309* (2013.01); *H01J 2237/2007* (2013.01)

(58) Field of Classification Search
CPC .... H01J 37/26; H01J 37/20; H01J 2237/2007; G01N 2223/309
USPC .................................................. 250/442.11
See application file for complete search history.

(56) References Cited

U.S. PATENT DOCUMENTS

| | | | | |
|---|---|---|---|---|
| 3,814,356 A | * | 6/1974 | Coleman | H01J 37/02 248/638 |
| 4,596,934 A | | 6/1986 | Yanaka et al. | |
| 4,954,712 A | | 9/1990 | Wilcox | |
| 8,754,384 B1 | * | 6/2014 | Persoon | H01J 37/20 250/306 |
| 2007/0029481 A1 | | 2/2007 | Morrison | |
| 2011/0180724 A1 | * | 7/2011 | Terada | H01J 37/185 250/442.11 |
| 2015/0170873 A1 | | 6/2015 | Miyazaki | |

FOREIGN PATENT DOCUMENTS

| | | |
|---|---|---|
| EP | 3699948 A1 | 8/2020 |
| KR | 101743146 B1 | 6/2017 |

OTHER PUBLICATIONS

Melanson, Linda, "Cyro TEM from specimen prep to microscope" Cyro TEM workshop Baylor College of Medicine, Oct. 2006.

* cited by examiner

*Primary Examiner* — Kiet T Nguyen
(74) *Attorney, Agent, or Firm* — Benoit & Côté Inc.

(57) ABSTRACT

A tool is provided for assembling a specimen carrier assembly in an electron imaging apparatus, the assembly comprising a specimen holder, an object grid containing a sample during measurement, and a C-shaped resilient fixing ring for removably fixing the object grid into a groove of the specimen holder. The tool comprises an elongate hollow handling device with a holding sleeve surrounding a cylindrical pin that is translatory movable within the holding sleeve in both directions between a first position in which the pin protrudes from the holding sleeve at its lower end and a second position in which the pin is retracted into the holding sleeve. The hollow handling device is configured such that the C-shaped fixing ring can be pushed into the specimen holder groove by moving the cylindrical pin into its first position. This allows the object grid to be conveniently and reliably fixed in the carrier assembly.

13 Claims, 5 Drawing Sheets

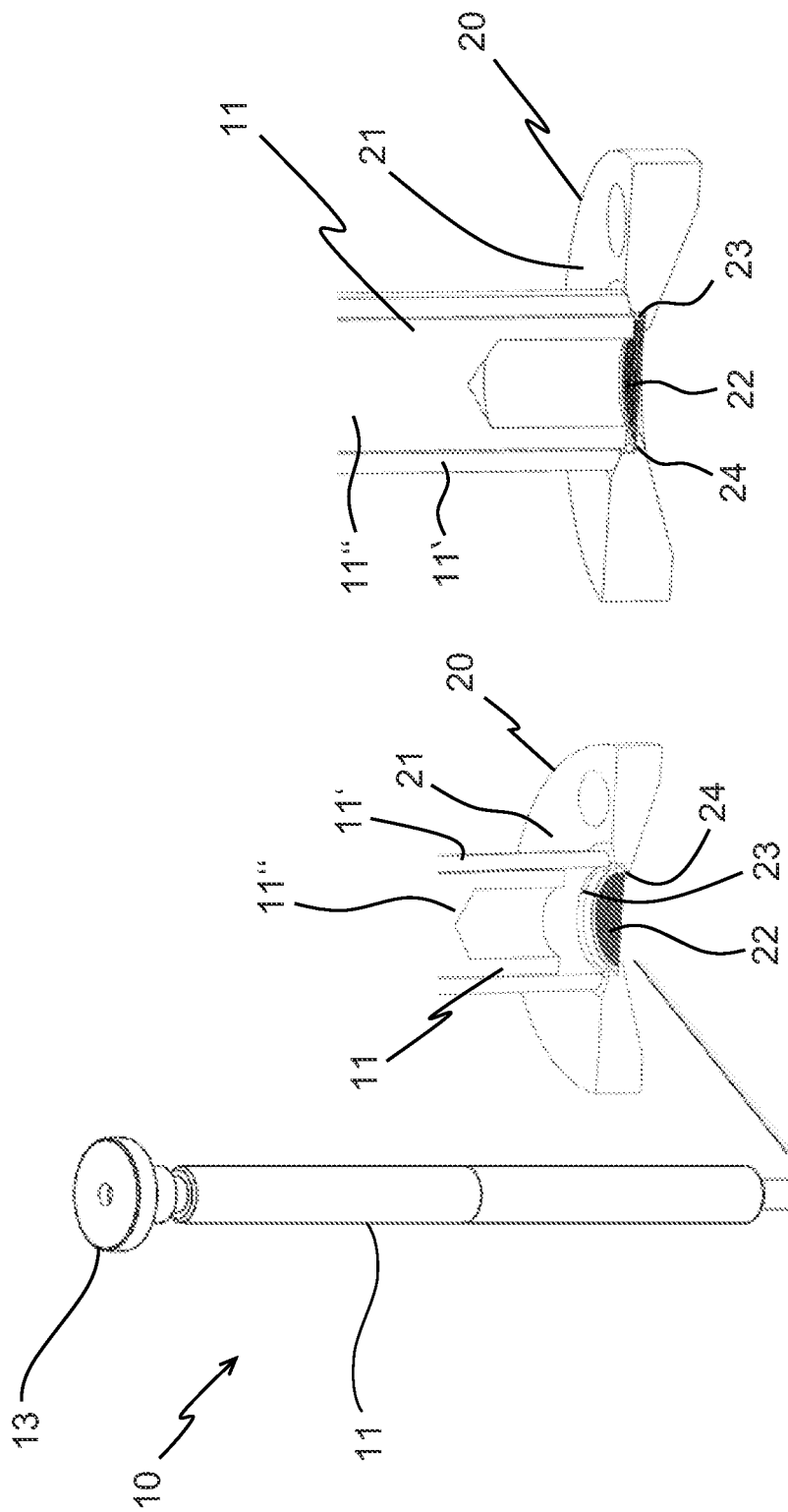

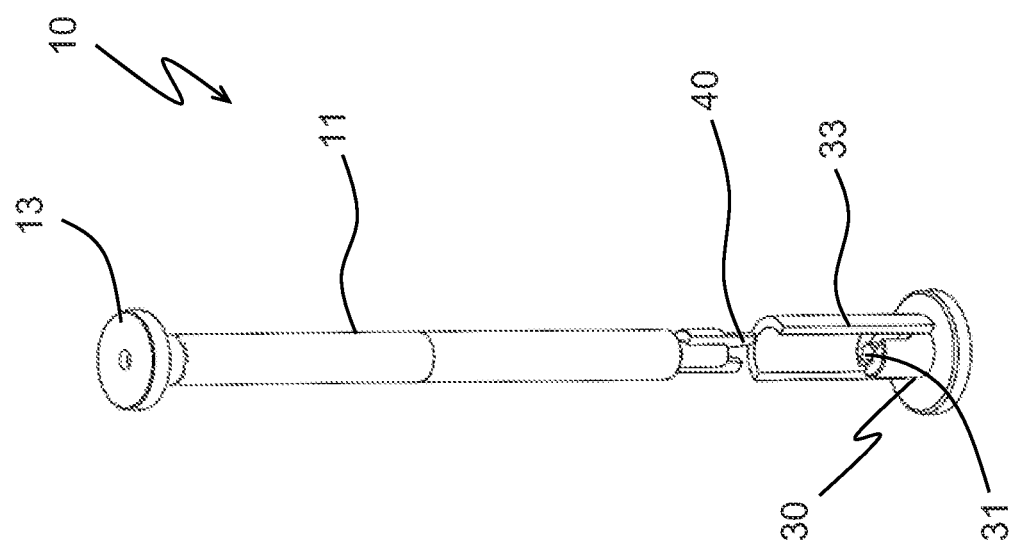
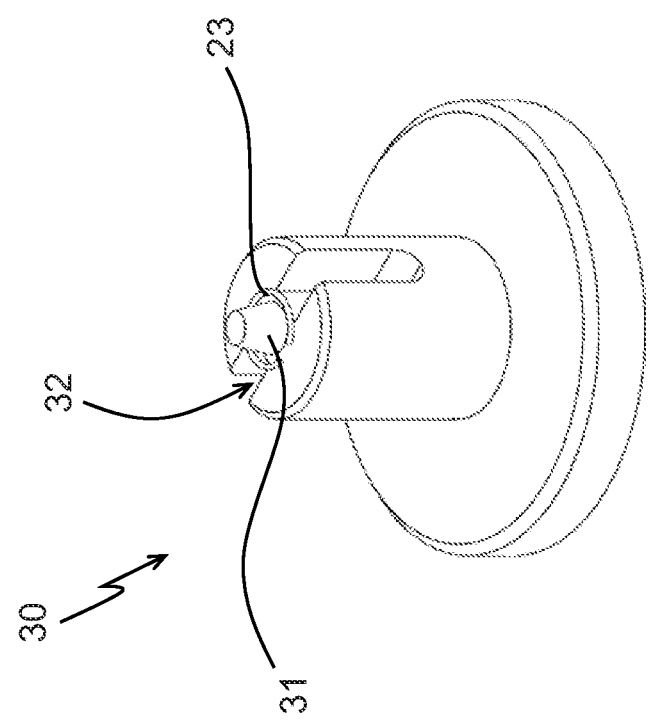
Fig.3a
Fig.3b

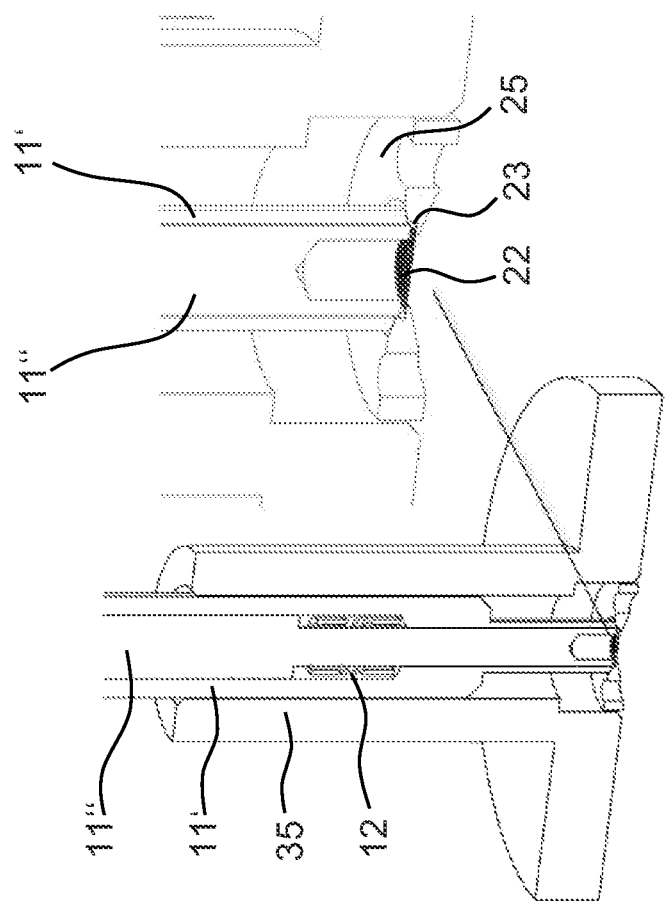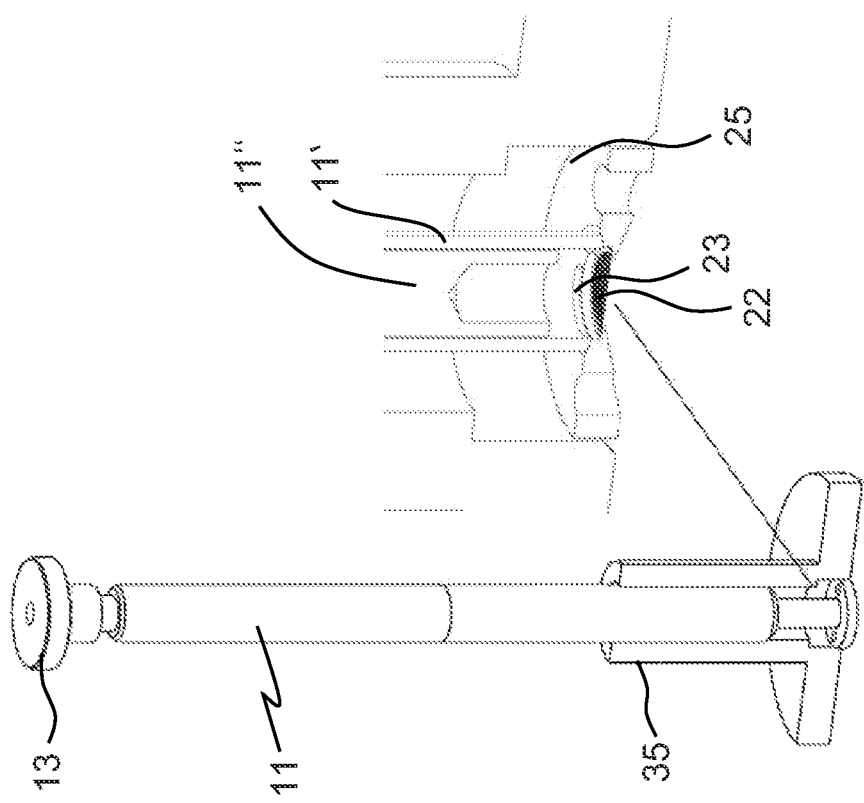

TOOL FOR TEM GRID APPLICATIONS

BACKGROUND OF THE INVENTION

Field of the Invention

The invention relates to a tool for assembling a specimen carrier assembly in an electron imaging apparatus, the specimen carrier assembly comprising a specimen holder, an object grid containing the sample during measurement in the analytical apparatus, and a C-shaped resilient fixing ring for removably fixing the object grid into a groove of the specimen holder.

Description of the Related Art

A specimen carrier assembly of the above defined kind, which can be assembled with this tool and which comprises a specimen holder, an object grid and a C-shaped resilient fixing ring is known per se from U.S. Pat. No. 4,596,934 A1.

In general, the present invention relates to apparatuses in the technical field of electron based imaging techniques, in particular to transmission electron microscopy, but also to electron diffraction on single molecules and similar analytic methods.

When applying transmission electron microscopy ("TEM"), a beam of electrons is transmitted through a specimen to form an image. The specimen is most often an ultrathin section less than 100 nm thick or a suspension on an object grid. An image is formed from the interaction of the electrons with the sample as the beam is transmitted through the specimen. The image is then magnified and focused onto an imaging device. This technique is capable of imaging at a significantly higher resolution than light microscopes enabling the instrument to capture fine detail even as small as a single column of atoms. TEM is a major analytical method in the physical, chemical and biological sciences. TEM instruments boast an enormous array of operating modes including conventional imaging, scanning TEM imaging (STEM), diffraction, spectroscopy, and combinations of these. TEM is capable of returning an extraordinary variety of nanometer- and atomic-resolution information. For this reason, TEM is regarded as an essential tool for nanoscience in both biological and materials fields.

In devices for single molecule electron diffraction or for TEM, the object of interest (usually a protein) is applied to an electrically conductive object grid. These grids typically consist of Cu or Au, with a very small grid pitch of a few micrometres. The grid itself is only 3 mm in diameter and must be clamped in a specimen holder free of play, because the carrier is moved in several degrees of freedom in the electron beam to observe the target molecule. The standardized microscope slide grid is fixed to a usually circular aperture in the slide with a maximum diameter of 3 mm. Accordingly, it is a challenge for the user to manually clamp the grid firmly into the carrier.

US 2007/0029481 A1 in detail describes a specimen tip and tip holder assembly, especially for use in TEM systems. However, no C-shaped resilient fixing ring like in U.S. Pat. No. 4,596,934 A1 is disclosed in US 2007/0029481 A1 nor any tool for assembling such specimen carrier assembly.

KR 10-1743146 B1 discloses a specimen holder for an atomic force microscope ("AFM"), which is configured so that a specimen can be observed by the AFM. The sample holder comprises a main body a specimen-mounting groove formed on one side of the main body, a sample grid mounted on the sample-mounting groove, a fixing ring for holding the sample grid, a fixing ring insertion groove formed in an inner wall surface of the specimen-mounting groove for inserting the fixing ring. The fixing ring is formed in the shape of a closed circular ring having a diameter slightly larger than the diameter of the specimen mounting groove and is mounted on the sample grid can be more stably fixed and prevented from vibrating within the specimen mounting groove to prevent damage to the specimen.

KR 10-1743146 B1 further discloses a method for observing a specimen using an AFM, the method comprising:

Positioning a sample grid in a specimen mounting groove formed in a body of a specimen transporting apparatus for an AFM;

Inserting a retaining ring into a retaining ring insertion groove formed on an inner wall side of the specimen mounting groove;

Attaching the fixture to the fixture mounting groove formed at the upper end of the specimen mounting groove;

Transferring and mounting the specimen transporting apparatus having the sample grid inserted therein to the atomic force microscope, thereby performing observations.

The grid is fixed via ring and clamping plate, resulting in a comparatively high overall height of the assembly.

US 2015/170873 A1 describes a specimen holder tip part for use in an electron microscope, the holder comprising: a specimen setting seat, a specimen mesh for mounting a specimen, a specimen holding part for holding the specimen mesh and a clamping part that clamps the specimen holding part.

Further, a desorption tool, in particular a jig for attaching a ring for holding specimen is disclosed. A collet part of a jig for attaching a ring for holding a specimen is provided. The specimen holding part is a ring for holding specimen. Further, a rod with mechanism of opening the collet part of the jig for attaching a ring for holding specimen is shown.

According to US 2015/170873 A1, the rod is pushed and the collet is expanded to fit successfully into the groove within the ring. Thereby the ring and the mounting jig are being momentarily integrated. At a state that the jig for attaching fixes the ring, it is fixed through the specimen mesh to the specimen holder tip part. By virtue of the taper provided on the ring, the ring meshes with the clamp part to be fixed to the specimen holder tip part.

U.S. Pat. No. 4,954,712 A discloses a movable specimen holder for an electron microscope which supports a circular specimen grid. The grid is retained in the counterbore by a resilient split band or ring having an outer cylindrical surface for engaging the counterbore with a friction fit.

A C-shaped ring has a cylindrical inner surface interrupted by an annular recess or groove, which is adapted to receive the outwardly projecting feet on the spring legs of a tweezers-like tool. The tool is used to insert the retaining ring into the counterbore adjacent the specimen grid and to remove the ring from the counterbore without losing the ring.

The positioning tool is constructed in the general form of tweezers having parallel spaced and spring biased leg portions. The two leg portions have corresponding outwardly projecting tabs or feet, which fit within diametric portions of the groove to support the retaining ring during insertion and removal.

U.S. Pat. No. 4,596,934 A1—already cited above at the top page—describes a specimen holder device for TEM which comprises a specimen holder member and a specimen holder, a specimen mesh disposed on the specimen holder and a C-shaped ring-like mesh retaining spring for retaining fixedly the specimen mesh. However, any tool for fixing the C-ring or any method for handling the spring ring is not disclosed in U.S. Pat. No. 4,596,934 A1.

The specimen carrier assemblies known from prior art with an object grid and usually a graphene capsule are positioned via a vacuum load lock on a sample stage between an electron source and a detector. The sample stage is freely movable in the electron beam, most often both translatory and rotatory, in order to make the object accessible to the electron beam from as many sides as possible.

The most limiting factor in this context is the shading of the object of interest by the frame of the specimen stage and the clamps with which the specimen grid is mounted in the specimen carrier, because the object should be moved and exposed in the electron beam at the widest possible angle (usually about ±70°) in order to achieve the most complete diffraction image possible.

SUMMARY OF THE INVENTION

The present invention provides a handling tool, which allows the object grid to be reliably fixed in the carrier. Furthermore, the invention provides a method by which the specimen carrier system can be easily manufactured and a specimen carrier system comprising the specimen carrier, the object grid and the fixing clamp especially designed for convenient assembling.

The tool of the present invention for handling a tiny small C-ring spring clip when fixing the sample in the carrier provides a surprisingly simple and effective way to assemble a generic specimen carrier as defined above, and is characterized in that the tool comprises an elongate hollow handling device with a holding sleeve surrounding a cylindrical pin. The cylindrical pin is translatory movable within the holding sleeve in both directions from a first position in which the pin protrudes from the holding sleeve at its lower end to a second position in which the pin is retracted into the holding sleeve, and back. The hollow handling device is designed and dimensioned in such a way that the C-shaped fixing ring can be pushed into the groove of the specimen holder by moving the cylindrical pin into its first position.

The specimen holder has a through-hole of circular shape in its center, into which the object grid can be inserted, and a protrusion running inside the through-hole at a distance from a top side of the specimen holder and radially protruding from the inner wall of the through-hole towards its center.

The object grid in its mounted position within the sample holder is seated on the topward side of the protrusion.

The fixing ring in its mounted position after being inserted into the through-hole on the topward side of the object grid is clamping against the inner wall of the through-hole and coevally holding the object grid against the protrusion.

After the object grid has been inserted into the through-hole and is placed on top of the protrusion in the specimen holder, the C-shaped fixing ring can be pushed into the through-hole onto the object grid by moving the cylindrical pin into its first position, thereby pressing the fixing ring into place on top of the object grid.

According to the present invention, only one clip ring is used and it has thus a low overall height.

With respect to a method by which the specimen carrier system can be easily manufactured, the invention provides two alternative methods as described below in detail.

According to the invention, the specimen carrier system differs from prior art systems in a number of ways, including that a disk-shaped plate of the sample holder is conically beveled around its through-opening towards its center on both sides of the plate.

The specimen carrier system is also designed in such a way that the object grid is not shaded so that it can be tilted over a wide angle of at least 60°, preferably 70°, in two directions out of the plane in the electron beam without being shaded by the slide or the fixing clamp.

One class of embodiments of the invention are characterized in that the hollow handling device is designed and dimensioned in such a way that the fixing ring can be received inside the hollow holding sleeve when the cylindrical pin is in its second position and can slide out of the holding sleeve into the through-hole of the specimen holder, when the cylindrical pin is pushed onto it in its first position.

In its basic version, the cylindrical pin of said tool can be used to simply push the C-shaped fixing ring into its final position. For this embodiment, it is preferred that the sample holder is conically beveled around its through-opening towards its center such that the fixing ring can slide into the groove.

In another version in this class of embodiments, the tool comprises a holding device, preferably with a central, in particular tapered or conical, protrusion, on which the fixing ring can be placed and from which it can later be picked up with the hollow handling device. As the C-shaped fixing ring is small, it is easier for the user to place it on a conus for picking it up rather than from a flat surface.

In an advantageous variant of this version, the protrusion of the holding device projects centrally from a recess that can serve as an engagement for a fork-shaped gripper.

Preferably, a projection is attached to the protrusion of the holding device projecting vertically from the recess such that the fixing ring can be positioned correctly thereon. The protrusion serves to position the C-shaped fixing ring symmetrically onto the conus with the opening of the "C" matching the protrusion. This is important for the step of engaging the pre-tensioned C-ring with a fork-shaped gripper, as it could glide off the gripper if the "C" was not engaged symmetrically.

In a further development of the above embodiments, the fork-shaped gripper is designed in such a way that it can be placed on the lower end of the holding sleeve with a positive fit and that its fork can be inserted into the recess of the holding device.

This can be further improved in that a tapered part of the fork presses together when the fork-shaped gripper is placed on the holding device with the fixing ring, so that the ring slides into the sleeve of the handling device inside the fork, where it is held against the wall by the pretension of the fixing ring before being pressed into the specimen carrier to clamp the object grid.

In an advantageous class of further developments of the above embodiments, an additional guide sleeve around the folding device is provided for positioning the handling device vertically on the holding device.

Preferred variants of the above class of further developments are characterized in that the guide sleeve is of hollow cylindrical shape and designed such that its inner diameter fits with the outer diameter of the holding device so that the guide sleeve can be placed concentrically onto the holding device.

These variants can be even further improved in that the outer diameter of the fork-shaped gripper is equal to or less than the outer diameter of the holding device so that when the guide sleeve is placed on the holding device, the handling device with the fork-shaped gripper is placed in such a way that the fork engages vertically in the recess of the holding device.

In straightforward embodiments of the invention, an actuating element, in particular a button, is provided on the topward side of the cylindrical pin, and that the outer diameter of the actuating element is preferably larger than the outer diameter of the holding sleeve.

Another preferred embodiment of the invention is characterized in that a retracting element, in particular a return spring, is provided for holding the cylindrical pin in its second position retracted into the holding sleeve, whereby a force must be applied to the cylindrical pin in order to move or hold it in its first position in which the pin protrudes from the holding sleeve at its lower end.

It can be of advantage, when a blind boring is provided in the lower end of the cylindrical pin.

The present invention also covers a specimen carrier assembly for being assembled by means of a tool according to the invention, the specimen carrier system comprising a specimen holder, an object grid or mesh containing the sample during measurement in an analytical apparatus, and with a fixing mechanism for reversibly or removably fixing the object grid or mesh to the specimen holder, wherein the specimen holder comprises a plate having a top side and an adjacent bottom side and having a through-opening in its center, into which the object grid or mesh can be inserted and be fixed therein by a means of a C-shaped resilient fixing ring, wherein the disk-shaped plate of the sample holder has a protrusion running around the through-opening at a distance from the top side of the plate and is radially protruding from the inner side of the through-opening towards its center, wherein the object grid or mesh in its mounted position within the sample holder is seated on the topward side of the protrusion, wherein the C-shaped fixing ring in its mounted position after being inserted into the through-opening on the topward side of the object grid or mesh is clamping against the inner wall of the through-opening and pressing the object grid or mesh against the protrusion, and wherein the disk-shaped plate of the sample holder is conically beveled around the through-opening towards its center at a first side of the plate, is characterized in that the disk-shaped plate of the sample holder is conically beveled around the through-opening towards its center also at the second side of the plate.

The beveled surfaces allow a greater angle of view during the measurement/imaging as the shadowing is reduced. The finally mounted specimen carrier assembly carries a single molecule sample which structure is to be determined by electron beam transmission and diffraction. It is thus important to expose the molecule from all sides at a large angle opening to the electron beam. Thus, a both sided beveled surface allows a larger angle of view.

In another embodiment, the specimen carrier assembly is characterized in that the plate of the sample holder is disk-shaped with a circular through-bore perpendicular to a midplane of the plate, wherein the inner wall of the through-opening has a groove running circumferentially in the midplane, and that the C-shaped fixing ring is designed such that it fits in the groove.

The present invention also covers a method for assembling a specimen carrier assembly in an analytical apparatus by means of a tool as described above, characterized by the following steps:
(a) applying the object grid containing the measuring sample onto the protrusion in the through-hole of the specimen holder;
(b) putting the C-shaped fixing ring on top of the specimen holder over its through-hole;
(c) placing the elongate hollow handling device over the fixing ring; and
(d) moving the cylindrical pin into its first position and thereby pressing the fixing ring into place on top of the object grid.

It is much less effort for the user to clamp the grid with the pretensioned C-ring by using the tool.

A further method variant is also preferred which is characterized by the following steps:
applying the object grid containing the measuring sample onto the protrusion in the through-hole of the specimen holder;
placing the elongate hollow handling device over the C-shaped fixing ring;
retracting the cylindrical pin of the handling device in its second position inside the hollow holding sleeve;
pressing the lower end of the holding sleeve onto the fixing ring, thereby receiving the latter and holding it in a position under the cylindrical pin;
putting the handling device with the fixing ring on top of the specimen holder over its through-hole; and
moving the cylindrical pin into its first position and thereby pressing the fixing ring into place on top of the object grid inside the through-hole of the specimen holder. When the diameter of the holding sleeve is the same or smaller than the diameter of the inner rim of the through hole, the C-ring can be pushed directly into the groove of the specimen holder without blocking.

Further advantages can be extracted from the description and the enclosed drawing. The features mentioned above and below can be used in accordance with the invention either individually or collectively in any combination. The embodiments mentioned are not to be understood as exhaustive enumeration but rather have exemplary character for the description of the invention.

BRIEF DESCRIPTION OF THE DRAWINGS

FIG. 1a shows on its left side a spatial view of an embodiment of the tool according to the invention set on top of a specimen carrier and on its right side a sectional, partial and enlarged view of the specimen carrier assembly with the tool set thereon and with a fixing ring placed in between the upper surface of a specimen holder and the tool with retracted pin inside a holding sleeve of a hollow handling device.

FIG. 1b shows the same partial view as displayed on the right side of FIG. 1a, but with the pin inside the holding sleeve being pushed down for positioning the fixing ring on a groove of the specimen holder.

FIG. 3a shows an embodiment of a holding device with a central conical protrusion, on which the fixing ring is placed for being picked later, the holding device having a recess, that can serve as an engagement for a fork-shaped gripper.

FIG. 3b shows an embodiment of the entire positioning tool according to the invention with the holding device of FIG. 3a being surrounded by an additional guide sleeve (here in sectional view) and a handling device with a fork-shaped gripper on top of the additional guide sleeve.

FIG. 5a shows on its left side a spatial view of an embodiment of the tool according to the invention like in FIG. 1a set on top of a specimen carrier, the lower part of the handling device and the specimen carrier being surrounded by a further guide sleeve, and on its right side a sectional, partial and enlarged view of the specimen carrier assembly with the tool set thereon and with the fixing ring placed in between the upper surface of the specimen holder and the tool with retracted pin inside its holding sleeve, also like on the right side of FIG. 1a.

FIG. 5b shows sectional, partial and enlarged view of the tool as displayed on the right side of FIG. 5a, but with the pin inside the holding sleeve being pushed down—like a ball pen—for positioning the fixing ring on a groove of the specimen holder like in FIG. 1b.

DETAILED DESCRIPTION

Figure 2A:
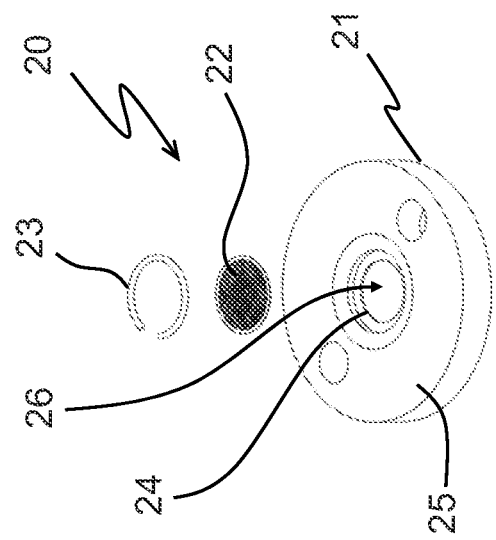
FIG. 2a shows a spatial view of a specimen carrier assembly according to the prior art comprising a specimen holder with a disk shaped plate having a through opening with a groove running therein, an object grid containing the sample during measurement in an analytical apparatus, and a C-shaped resilient fixing ring.

An essential component in electron diffraction is the specimen holder system, which is mounted on the stage in the high vacuum range of the microscope. As shown in the exploded drawing of FIG. 2a, the system comprises a specimen carrier assembly 20 with a specimen holder 21, an object grid 22 containing the sample during measurement in the analytical apparatus, and a C-shaped resilient fixing ring 23 for removably fixing the object grid 22 on a groove 24 in a through-opening 26 through a disk-shaped plate 25 of the specimen holder 21.

In order to expose the widest possible angle of the sample, the ring-shaped slide is conically beveled towards the center. The inner opening corresponds essentially to the size of the object grid 22, with a projection of the specimen holder 21 serving as a supporting edge for the grid. Since the grid has a diameter of only 3 mm, it is important that the C-shaped fixing ring 23 has a small thickness that does not protrude beyond the edge of the carrier, so that the clamping ring does not cause shading. At the same time, the clamping ring should have sufficient clamping force to ensure that the object grid 22 is fixed with as little movement as possible.

When the object grid 22 is inserted into the opening of the specimen holder 21, the C-shaped fixing ring 23 is inserted from the other side of the opening as a clamp and clamped in the groove 24, so that the object grid 22 is frictionally connected to the slide without play.

Figure 2B:
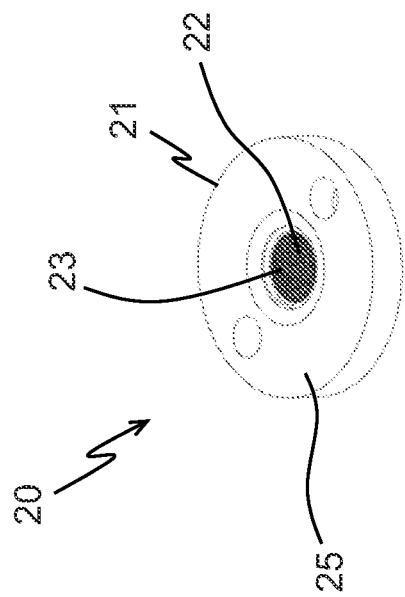
FIG. 2b shows the assembly of FIG. 2a with the object grid positioned inside the through opening sitting on the groove of the specimen holder and with the fixing ring placed on top of the object grid for fixing it in the specimen holder.

FIG. 2b shows how the object grid 22 is clamped in the specimen holder 21 by means of the fixing ring 23 inside the readily assembled specimen carrier 20. One can imagine that it is never trivial for the user to assemble these very small dimensioned components without creating scrap.

In this context, a beveled geometry of the carrier can be helpful, in particular when a steeper angle is arranged towards the center than towards the edge as shown in FIGS. 2a and 2b. The slope is shaped primarily because of the beam cone and to avoid shading when the carrier is rotated in the electron beam. But the steeper angle helps also to properly clam the C-ring clip assembly; the clip ring slips over the slope into the groove on a predetermined path.

In particular, the specimen holder 21 comprises the disk-shaped plate 25 having a top side and an adjacent bottom side and having the through-opening 26 in its center, into which the object grid 22 or mesh can be inserted and be fixed therein by means of the C-shaped resilient fixing ring 23. The plate 25 of the specimen holder 21 has the groove 24 running around the through-opening 26 at a distance from the top side of the plate 25 and is radially protruding from the inner side of the through-opening 26 towards its center. The object grid 22 in its mounted position within the specimen holder 21 is seated on the topward side of the groove 24. The fixing ring 23 in its mounted position after being inserted into the through-opening 26 on the topward side of the object grid 22 is clamping against the inner wall of the through-opening 26 and pressing the object grid 22 against the groove 24. The disk-shaped plate 25 of the specimen holder 21 is conically beveled around the through-opening 26 towards its center at a first side of the plate 25.

In preferred embodiments of the invention as depicted in FIGS. 1a and 1b, the disk-shaped plate 25 of the specimen holder 21 is conically beveled around the through-opening 26 towards its center also at the second side of the plate 25. The beveling of both surfaces allows a greater angle of view during the measurement/imaging as the shadowing is reduced. In particular, the plate 25 of the specimen holder 21 is disk-shaped with a circular through-bore 26 perpendicular to a midplane of the plate 25, wherein the inner wall of the through-opening 26 has a groove 24 running circumferentially in the midplane, and that the C-shaped fixing ring 23 is designed such that it fits in the groove 24.

In order to avoid errors during object preparation, the present invention proposes a specially designed tool 10 for assembling a specimen carrier assembly 20. With this tool 10 as depicted in FIGS. 1a, 3b and 5a, the clamping ring 23 can be inserted reliably and in a time-saving manner into the groove 24 of the specimen holder 21. In the simplest version, the tool 10 comprises an elongate hollow handling device 11 with a holding sleeve 11' surrounding a cylindrical pin 11", which is dimensioned in such a way that the C-shaped fixing ring 23 can slide into the groove 24, when the pin 11" is pressed onto it, once the object grid 22 and the fixing ring 23 have been inserted into the specimen holder 21.

The cylindrical pin 11" is surrounded by the holding sleeve 11', whereby the pin 11" is translatory movable within the sleeve 11' from a first position shown in FIG. 1b, in which the pin 11" protrudes from the sleeve 11' at the lower end, to a second position shown in FIG. 1a, in which the pin 11" is retracted into the holding sleeve 11'. In both positions, the top end of the pin 11" protrudes from the sleeve 11', so that the user can move the pin 11" between the two positions, similar to the mechanism of a ballpoint pen.

In the second position, the tool 10 allows the fixing ring 23 to be received inside the holding sleeve 11' as shown in FIG. 1a. The sleeve 11' can easily be placed on the specimen holder 21 to clamp the specimen grid 22 that is inserted into the carrier. By pushing the pin 11" forward, the fixing ring 23 is pushed out of the sleeve 11' into the designated groove 24.

Preferably, the hollow handling device 11 is designed and dimensioned in such a way that the fixing ring 23 can be received inside the hollow holding sleeve 11' when the cylindrical pin 11" is in its second position and can slide out of the holding sleeve 11', when the cylindrical pin 11" is pushed onto it in its first position.

As depicted in FIGS. 4a-4d and 5b, a resetting element 12, in particular a return spring, is provided for holding the cylindrical pin 11" in its second position retracted into the holding sleeve 11'. A force must be applied to the cylindrical pin 11" in order to move or hold it in its first position in which the pin 11" protrudes from the holding sleeve 11' at its lower end, similar to the operation of a ballpoint pen.

An actuating element 13, in particular a button, is provided on the topward side of the cylindrical pin 11". The outer diameter of the actuating element 13 is preferably larger than the outer diameter of the holding sleeve 11'.

A difficulty can arise when inserting the fixing ring 23 into the sleeve 11' of the tool 10, since the components are filigree. According to the invention, a holding device 30 is proposed for this purpose, onto which the C-shaped resilient fixing ring 23 is first placed. As shown in FIG. 3a, the holding device 30 comprises a tapered or conical protrusion 31 for holding the fixing ring 23. The cone protrudes centrally from a recess 32 that can serve as an engagement for a fork-shaped gripper 40 as depicted in FIG. 3b. Optionally, a small projection (not shown in the drawings) can be attached to the cone at 90° to the groove, so that the fixing ring 23 can be positioned correctly.

The fork-shaped gripper 40 is designed in such a way that it can be placed on the lower end of the holding sleeve 11' with a positive fit and that its fork can be inserted into the recess 32 of the holding device 30. Preferably, a tapered part of the fork compresses the C-ring 23 when the fork-shaped gripper 40 is placed on the holding device 30 with the fixing ring 23, so that the ring 23 slides into the sleeve 11' of the handling device 11 inside the fork, where it is held against the wall by the pretension of the fixing ring 23 before being pushed into the specimen holder 21 to clamp the object grid 22.

An additional guide sleeve 33 around the holding device 30—as depicted in FIG. 3b—is useful for positioning the handling device 11 vertically on the holding device 30. The guide sleeve 33 is of hollow cylindrical shape and designed such that its inner diameter fits with the outer diameter of the holding device 30 so that the guide sleeve 33 can be placed concentrically onto the holding device 30. The outer diameter of the fork-shaped gripper 40 is equal to or less than the outer diameter of the holding device 30 so that when the guide sleeve 33 is placed on the holding device 30, the handling device 11 with the fork-shaped gripper 40 is placed in such a way that the fork engages vertically in the recess 32 of the holding device 30.

Figure 4D:
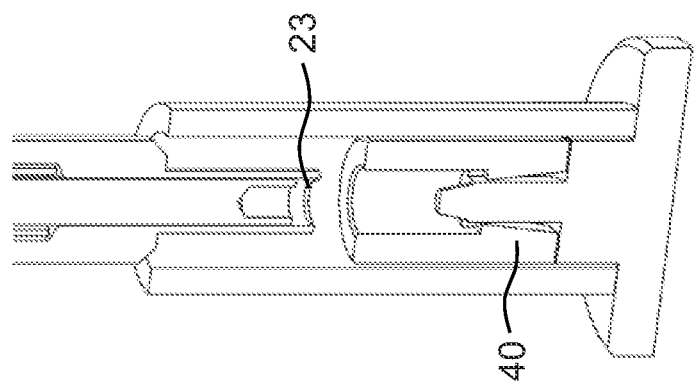
FIG. 4d shows a fourth procedural step for inserting the clamping ring into the tool of FIG. 3b using the holding device of FIG. 3a equipped with a fork-shaped gripper.
Figure 4C:
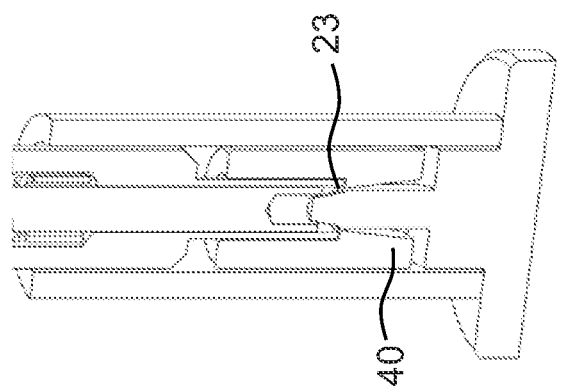
FIG. 4c shows a third procedural step for inserting the clamping ring into the tool of FIG. 3b using the holding device of FIG. 3a equipped with a fork-shaped gripper.
Figure 4B:
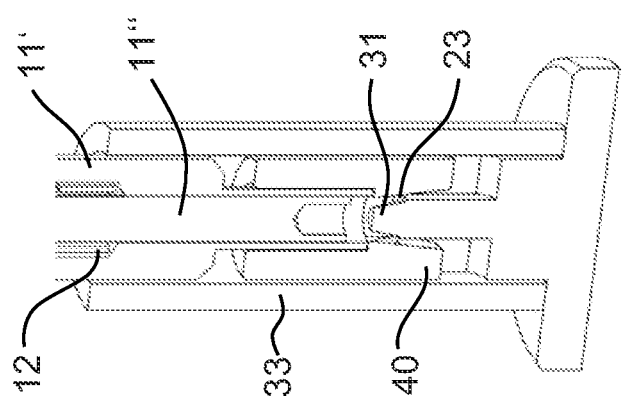
FIG. 4b shows a second procedural step for inserting the clamping ring into the tool of FIG. 3b using the holding device of FIG. 3a equipped with a fork-shaped gripper.
Figure 4A:
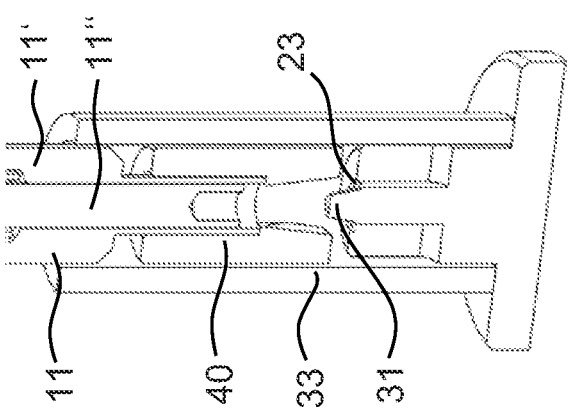
FIG. 4a shows a first procedural step for inserting the clamping ring into the tool of FIG. 3b using the holding device of FIG. 3a equipped with a fork-shaped gripper.

FIGS. 4a to 4d illustrate the essential procedural steps for inserting the fixing ring 23 into the tool 10 of FIG. 3b, where the handling device 11 is equipped with a fork-shaped gripper 40:

In FIG. 4a, the fixing ring 23 is positioned on the conical protrusion 31 of the holding device 30 and the handling device 11 is inserted into the guide sleeve 33 above the holding device 30.

In FIG. 4b, the fork-shaped gripper 40 of the handling device 11 is inserted into the recess 32 of the holding device 30.

In FIG. 4c, the lower end of the holding sleeve 11' is put over the fixing ring 23 in such a way that the fixing ring 23 is received in the hollow end of the holding sleeve 11'.

In FIG. 4d, the handling device 11 together with the fixing ring 23 positioned inside the hollow holding sleeve 11' is retracted from the holding device 30, leaving the fork-shaped gripper 40 on the holding device 30 inside the guide sleeve 33.

The following steps for mounting the fixing ring 23 on top of the object grid 22 on the groove 24 inside through-opening 26 of the plate 25 are illustrated in FIGS. 5a and 5b.

In FIG. 5a, the handling device 11 together with the fixing ring 23 positioned inside the hollow holding sleeve 11' is inserted into a further guide sleeve 35 placed around the specimen holder 21 with the object grid 22 already positioned on the groove 24 within the through-opening 26 of the plate 25 while the cylindrical pin 11" is still in its second position retracted inside the holding sleeve 11'.

In FIG. 5b, the cylindrical pin 11" of the handling device 11 is pushed into its first position, in which the pin 11" protrudes from the hollow holding sleeve 11' at its lower end, thereby placing the fixing ring 23 on top of the object grid 22.

The invention claimed is:

1. A tool for assembling a specimen carrier assembly of an electron imaging apparatus, the specimen carrier assembly having a specimen holder, an object grid containing a sample during measurement in the electron imaging apparatus, and a C-shaped resilient fixing ring for removably fixing the object grid into a groove located adjacent to a through-opening of the specimen holder, the tool comprising an elongate hollow handling device with a holding sleeve surrounding a cylindrical pin that is translatory movable within the holding sleeve in both directions from a first position in which the pin protrudes from the holding sleeve at its lower end to a second position in which the pin is retracted into the holding sleeve and back, the hollow handling device being configured such that the C-shaped fixing ring can be pushed into the groove of the specimen holder by moving the cylindrical pin into its first position.

2. A tool according to claim 1, wherein the hollow handling device is configured such that the fixing ring can be received inside the hollow holding sleeve when the cylindrical pin is in its second position and can slide out of the holding sleeve, when the cylindrical pin is pushed onto it in its first position.

3. A tool according to claim 2 further comprising a holding device with a central protrusion on which the fixing ring can be placed and from which it can later be picked up with the hollow handling device.

4. A tool according to claim 3, wherein the protrusion of the holding device projects centrally from a recess that can serve as an engagement for a fork-shaped gripper.

5. A tool according to claim 4 further comprising a projection attached to the protrusion of the holding device projecting vertically from the recess such that the fixing ring can be positioned correctly thereon.

6. A tool according to claim 4, wherein the fork-shaped gripper is configured such that it can be placed on the lower end of the holding sleeve with a positive fit and such that its fork can be inserted into the recess of the holding device.

7. A tool according to claim 6, wherein a tapered part of the fork presses together when the fork-shaped gripper is placed on the holding device with the fixing ring, so that the ring slides into the sleeve of the handling device inside the fork, where it is held against a wall by the pretension of the fixing ring before being pressed into the specimen holder to clamp the object grid.

8. A tool according to claim 3 further comprising a guide sleeve around the holding device for positioning the handling device vertically on the holding device.

9. A tool according to claim 8, wherein the guide sleeve is of hollow cylindrical shape and has an inner diameter that fits with an outer diameter of the holding device so that the guide sleeve can be placed concentrically onto the holding device.

10. A tool according to claim 9, wherein an outer diameter of a fork-shaped gripper is equal to or less than the outer diameter of the holding device so that when the guide sleeve is placed on the holding device, the handling device with the fork-shaped gripper is placed in such a way that the fork engages vertically in the recess of the holding device.

11. A method for assembling a specimen carrier assembly in an electron imaging apparatus by using a tool according to claim 2, the method comprising:
   (a) locating the object grid containing the measuring sample in the groove in the through-opening of the specimen holder;
   (b) placing the elongate hollow handling device over the C-shaped fixing ring;
   (c) retracting the cylindrical pin of the handling device to its second position inside the hollow holding sleeve;
   (d) pressing the lower end of the holding sleeve onto the fixing ring (23), thereby receiving the latter and holding it in a position under the cylindrical pin;
   (e) putting the handling device with the fixing ring on top of the specimen holder over its through-opening; and
   (f) moving the cylindrical pin into its first position and thereby pressing the fixing ring into place on top of the object grid inside the through-opening of the specimen holder.

12. A tool according to claim 1 further comprising a resetting element for holding the cylindrical pin in its second position retracted into the holding sleeve, whereby a force must be applied to the cylindrical pin in order to move or hold it in its first position in which the pin protrudes from the holding sleeve at its lower end.

13. A method for assembling a specimen carrier assembly in an electron imaging apparatus using a tool according to claim 1, the method comprising:
   (a) locating the object grid containing the measuring sample in the groove of the specimen holder;
   (b) placing the C-shaped fixing ring on the specimen holder above its through-opening;
   (c) placing the elongate hollow handling device over the fixing ring; and
   (d) moving the cylindrical pin into its first position and thereby pressing the fixing ring into place on top of the object grid.

\* \* \* \* \*